United States Patent
Yost (10) Patent No.: US 10,209,078 B2
(45) Date of Patent: Feb. 19, 2019

(54) LOCAL PERTURBATION REJECTION USING TIME SHIFTING

(71) Applicant: Yost Labs Inc., Portsmouth, OH (US)

(72) Inventor: Paul Yost, Portsmorth, OH (US)

(73) Assignee: Yost Labs Inc., Portsmouth, OH (US)

( * ) Notice: Subject to any disclaimer, the term of this patent is extended or adjusted under 35 U.S.C. 154(b) by 0 days.

(21) Appl. No.: 15/692,135

(22) Filed: Aug. 31, 2017

(65) Prior Publication Data
US 2018/0058857 A1 Mar. 1, 2018

Related U.S. Application Data

(60) Provisional application No. 62/381,837, filed on Aug. 31, 2016.

(51) Int. Cl.
*G01R 33/00* (2006.01)
*G01C 21/16* (2006.01)
*G01C 17/38* (2006.01)

(52) U.S. Cl.
CPC .......... *G01C 21/165* (2013.01); *G01C 17/38* (2013.01); *G01R 33/0064* (2013.01); *G01R 33/0017* (2013.01)

(58) Field of Classification Search
CPC ............ G01R 33/0064; G01R 33/0017; G01C 21/16; G01C 21/165; G01C 21/20; G01C 17/38; G01C 19/32; G01C 19/58
See application file for complete search history.

(56) References Cited

U.S. PATENT DOCUMENTS

| | | | | |
|---|---|---|---|---|
| 4,414,753 A | * | 11/1983 | Moulin | G01C 17/38 33/356 |
| 2012/0259572 A1 | * | 10/2012 | Afzal | G01C 21/165 702/92 |
| 2015/0354958 A1 | * | 12/2015 | Honkura | G01C 19/58 702/151 |
| 2018/0025502 A1 | * | 1/2018 | Menozzi | G06F 1/163 345/633 |

* cited by examiner

*Primary Examiner* — Thang X Le
(74) *Attorney, Agent, or Firm* — Edell, Shapiro & Finnan, LLC (57) ABSTRACT

A system, a method and a computer program product are provided for local perturbation immunity in a vector-based sensing device. Measurement data from at least one vector-based sensing device is evaluated at a given time using a heuristic to identify an occurrence of a perturbing event, wherein the at least one vector-based sensing device includes either a magnetometer or an accelerometer, or both the magnetometer and the accelerometer. A time-shifting component is provided to reject the perturbing event for a duration of the perturbing event and use measurement data from a gyroscope to construct vector-based sensing device measurement data unaffected by the perturbing event.

20 Claims, 5 Drawing Sheets

LOCAL PERTURBATION REJECTION
USING TIME SHIFTING

This application claims priority to U.S. Provisional Application No. 62/381,837, entitled "A System For Local Magnetic Perturbation Rejection Using Time Shifting", filed in the U.S. Patent and Trademark Office on Aug. 31, 2016. U.S. Provisional Application No. 62/381,837 is incorporated by reference, herein, in its entirety.

TECHNICAL FIELD

Present invention embodiment relates to a system, a method and a computer program product for local perturbation immunity, for example, in Inertial Measurement Units, Attitude and Heading Reference Systems, Compassing Systems, Inertial Navigation Systems, etc., which use time shifting to reject a disturbance for a duration of a perturbation event.

BACKGROUND

Multiple systems use a vector-valued sensor such as a magnetometer, also known as a compass, to measure a strength and direction of the Earth's magnetic field, or an accelerometer to measure acceleration forces applied to a sensor body such as a constant force of gravity and dynamic forces that can be caused by moving or vibrating the sensor body.

Systems that generally measure the strength and direction of the Earth's magnetic field and use results of these measurements as a critical part of providing their core functionality include 9 DOF Inertial Measurement Units (IMU), Attitude and Heading Reference Systems (AHRS), Compassing Systems, and Inertial Navigation Systems (INS).

For accurate results to be produced, each system that uses magnetic sensing elements must be calibrated to account for distortions that affect the sensed magnetic field. These magnetic distortions are generally considered to be one of two types: hard-iron distortions or soft-iron distortions. Hard-iron distortions are caused by objects that produce a magnetic field such as a nearby current carrying conductor or a permanent magnet in a nearby component such as a speaker or microphone. When the magnetic material is part of the system and physically attached to the same reference frame as the sensor, a permanent bias in the sensor output is created. Soft-iron distortions are caused by objects that, by being present, passively distort the reference magnetic field. The presence of these soft-iron objects causes the Earth's magnetic field to be stretched, bent, or otherwise distorted. Soft-iron effects vary depending upon which direction the Earth's magnetic field is oriented relative to the sensor body itself. Soft-iron distortion is often caused by the presence of nearby ferrous metal objects and structures made of materials such as iron, steel or nickel. Hard-iron distortions will generally have a much larger impact upon the total error than soft-iron effects.

Methods exist for performing a calibration process which is used to determine the nature of these error effects within the system and compute parameters to be used in a corrective step as the sensor operates. In this way, a sensor system can be calibrated to correct for both hard-iron and soft-iron effects. Since such systems are often not located within either fixed locations or unchanging environments, such systems are often subject to external effects that can cause changes to the magnetic domain in which the sensor is situated. The system may move through a magnetic environment in which the Earth's magnetic field is distorted or an external object which causes a distortion may move into the sensor's environment. In this manner, the sensor, having been calibrated for the original magnetic environment, will experience erroneous sensor readings due to the altered magnetic environment.

Movement or vibration of an accelerometer sensor body can cause accelerometer perturbations, which can affect accuracy of accelerometer readings such as measurement of a gravitational force or down vector. Parameters can be computed for use in correcting accelerometer measurements and the accelerometer operates. However, if the movement of the accelerometer sensor body changes, accelerometer readings can become distorted due to accelerometer perturbations.

SUMMARY

In a first aspect of present invention embodiments, a system for identifying a perturbation and providing perturbation immunity in a vector-based sensing device is provided. The system includes: at least one vector-based sensing device from a group of vector-based sensing devices consisting of a magnetometer and an accelerometer; a gyroscope configured to sense a rate of change of angular velocity over time and provide output measurement data representing rates of change in 3-space; a processing element coupled to the at least one vector-based sensing device; and a memory element coupled to the processing element. The processing element is operable to: evaluate measurement data from the at least one vector-based sensing device at a given time using a heuristic to identify an occurrence of a perturbing event; and provide a time-shifting component to reject the perturbing event for a duration of the perturbing event and use the measurement data from the gyroscope to construct vector-based sensing device measurement data unaffected by the perturbing event.

In a second aspect of the present invention embodiments, a method for identifying a perturbation and providing local perturbation immunity in a vector-based sensing device is provided. The method includes: evaluating, by a processing device, measurement data from at least one vector-based sensing device at a given time using a heuristic to identify an occurrence of a perturbing event, the at least one vector-based sensing device being from a group of vector-based sensing devices consisting of a magnetometer and an accelerometer; and providing, by the processing device, a time-shifting component to reject the perturbing event for a duration of the perturbing event and use measurement data from a gyroscope to construct vector-based sensing device measurement data unaffected by the perturbing event.

In a third aspect of the invention, a computer program product is provided. The computer program product includes at least one computer readable storage medium having computer readable program code embodied therewith for execution on at least one processor. The computer readable program code is configured to be executed by the at least one processor to perform: evaluating measurement data from at least one vector-based sensing device at a given time using a heuristic to identify an occurrence of a perturbing event, the at least one vector-based sensing device being from a group of vector-based sensing devices consisting of a magnetometer and an accelerometer; and providing a time-shifting component to reject the perturbing event for a duration of the perturbing event and use measurement data from a gyroscope to construct vector-based sensing device measurement data unaffected by the perturbing event.

DETAILED DESCRIPTION

Figure 1:
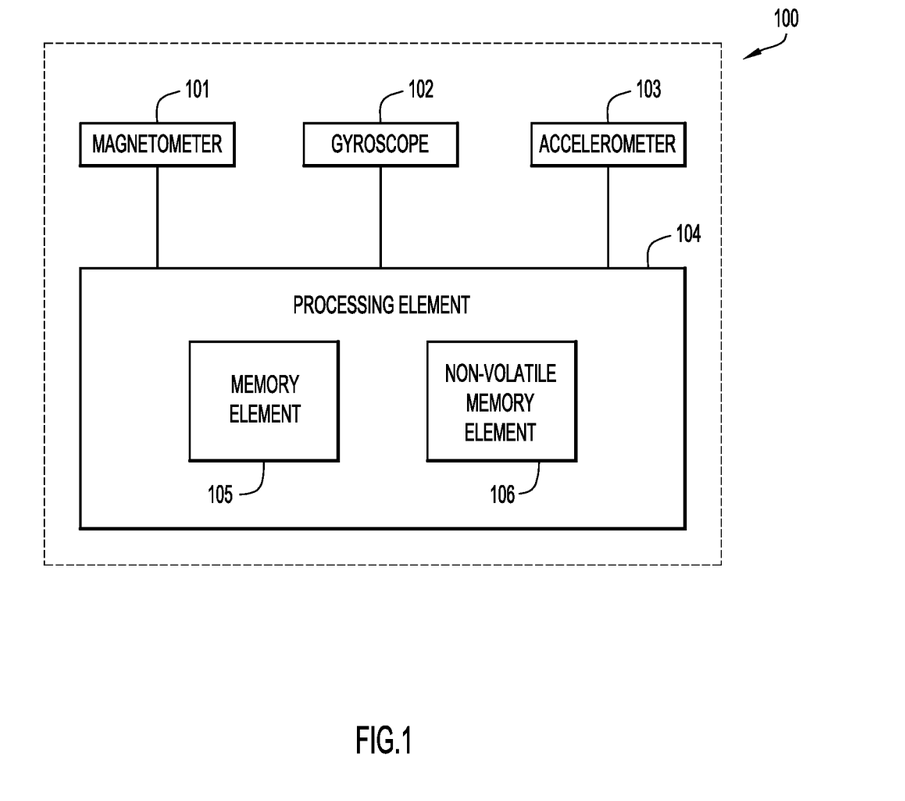
FIG. 1 is a block diagram of a system for local magnetic perturbation immunity according to an embodiment of the present invention.

FIG. 1 is a block diagram of an embodiment of the present invention illustrating a system 100 for local perturbation immunity. The system employs multiple sensing elements and other components, such as a magnetometer 101, a rate gyroscope 102, an accelerometer 103, a processing element 104, a memory element 105, and a non-volatile memory element 106.

The magnetometer 101 of the present invention embodiment senses a magnitude and direction of Earth's magnetic field. The magnetometer 101 may have a multitude of axes such that output of the magnetometer 101 represents a vector that indicates a direction and a magnitude of a sensed magnetic field in 3-space.

The rate gyroscope 102 of the present invention embodiment senses a rate of change of angle (angular velocity) over time. The rate gyroscope 102 may have a multitude of axes such that output of the rate gyroscope 102 represents rates in change of an entire sensor body in 3-space. Thus, the output of the rate gyroscope is a derivative of an angular position over time. Using this output, an angular position can be computed by integrating the angular velocity over time. Since the sensing elements are not perfect and the output of the sensors is being integrated using a computed integral that is based upon a sum of a finite number of samples taken at discrete time intervals, a computed value will be imperfect. Thus, due to sensor element noise, measurement noise, and integral approximation, results will contain error terms and, due to the process of integration, the error terms will tend to grow with time. This accumulated error over time is called drift.

The accelerometer 103 of the present invention embodiment senses acceleration forces applied to a sensor body of accelerometer 103. The sensed acceleration forces are a sum of static forces, such as a constant force of gravity acting on the sensor, and dynamic forces, such as those caused by moving or vibrating the sensor body. The accelerometer 103 may have a multitude of axes such that an output represents a vector that indicates a direction and a magnitude of the sensed acceleration forces in 3-space. The accelerometer output vector may be used to aid in providing a vector that can be used as a reference to remove or limit gyroscope drift.

The processing element 104 of the present invention embodiment is an element (e.g., processor, controller, etc.) configured to process sensor readings and apply steps to perform computations and produce a time-shifting component that results in perturbation rejection, while the memory element 105 is used to store a number of sensor readings over time along with other partial results, such as computed sensor confidence factors, computed sensor variance, process state variables, and other process variables. The processing element 104 may store and retrieve the sensor readings and computed values according to a method described below. Similarly, the non-volatile memory element 106 of the present invention embodiment may store system parameters and calibration parameters that can be loaded upon start-up.

Each system that uses magnetometers may output sensor data itself, often after calibration steps are applied, or may output results of computations using the sensor data as an input. For each type of system, the inputs are similar but the utilization of the sensor data or the produced output may be different. For instance, (a) Inertial Measurement Units (IMU) generally read the data from the sensor components and output the resulting sensor data in real-time. However, the IMU may also perform calibration steps upon the sensor data.

(b) Attitude and Heading Reference Systems (AHRS) read the same data from the sensor components, but generally perform both calibration and computational steps on-board to convert the sensor data from multiple independent sensor data values into useful navigation outputs such as attitude (pitch & roll) and heading (yaw). Outputs are generally produced in real-time to allow use for navigation.

(c) Compassing Systems are more limited versions of the AHRS and generally perform similar computations, but often have fewer sensor elements and more restricted usage domains that simply require an azimuth (yaw) or magnetic vector output. Outputs are generally produced in real-time to allow use for navigation.

(d) Inertial Navigation Systems (INS) are similar to AHRS systems, but often perform additional computational steps to continuously calculate the orientation, velocity, and position of a system moving object without the need for external references.

Each system type described above requires the magnetometer to be calibrated to achieve accurate results. Additionally, the real-time nature of each of these systems makes them sensitive to changes in the magnetic environment that may occur during normal usage. For example, if an external event occurs that distorts or otherwise disturbs the Earth's magnetic field, even if for a brief time, accuracy of the system itself can be compromised for a duration of the external disturbance and potentially following the disturbance.

A present invention embodiment described below provides a means of identifying such disturbances and ensuring that the system output accuracy is unaffected by temporary or transient disturbances to Earth's magnetic field. This is accomplished by using a method of time-shifting the sensor data and an innovative method that uses a virtual sensor output to maintain real-time performance.

Figure 2:
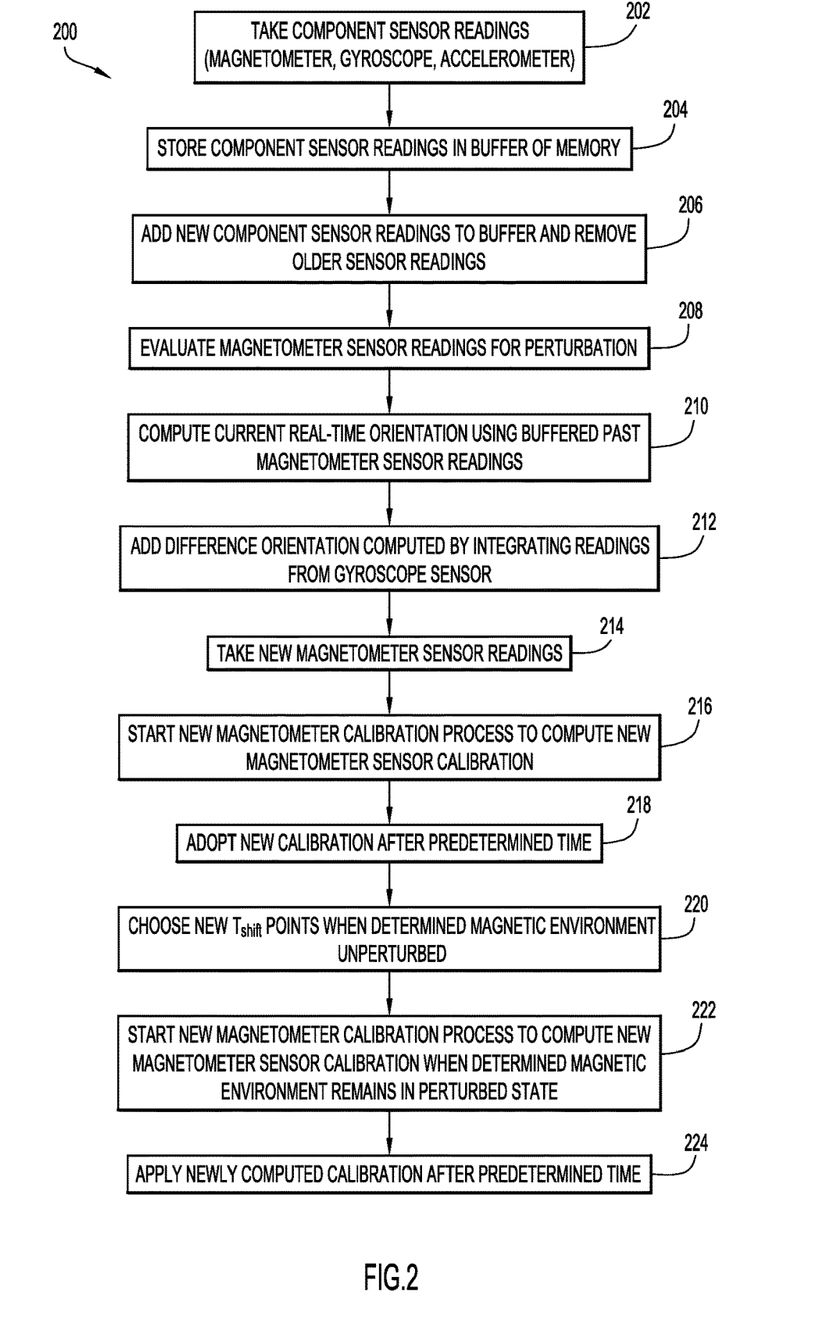
FIG. 2 is a flowchart depicting an example process for local magnetic perturbation immunity according to an embodiment of the present invention.

Referring to FIG. 2, the method (process) 200 of a present invention embodiment begins at step 202 by taking sensor readings from each axis of the component sensors (e.g., magnetometer, gyroscope, and accelerometer) as follows:
Magnetometer: MX, MY, MZ
Gyroscope: GX, GY, GZ
Accelerometer: AX, AY, AZ (accelerometer, however, can be optional)
Sample Timestamp: T
Computed Orientation: QX, QY, QZ, QW (may be in a form other than a quaternion)

At a given time, each set of sensor sample readings taken in step 202 is stored in a buffer of memory element 103 along with time-stamp (T) of the sensor readings (step 204). Thereafter, new samples are added to the buffer and older samples may be removed from the buffer so as to limit the buffer's size (step 206). This gives a historical buffer of N samples going back in time for an amount of time of duration $T_0$-$T_N$, where $T_0$ is the most recent reading and $T_N$ is the oldest historical reading.

Within this buffer, each set of magnetometer readings at a particular time is evaluated by the processing element 104 for perturbation (step 208). That is, since magnetometer perturbation can occur at any time, the perturbing event may begin subtly, strengthen, and then lessen and subside, it is important to evaluate each sample in an attempt to identify the occurrence of a perturbing event. This is done using a heuristic that involves evaluating each magnetometer reading at a given time against one or more of the following:

(a) length of a magnetometer vector, (b) angle between the magnetometer vector and a down/up vector of the accelerometer or computed orientation, (c) distance of the magnetometer vector from the surface of the previously computed magnetometer calibration sphere, (d) changes in the angle or direction of the magnetometer vector that do not match the changes in the computed orientation, (e) differences in the change of the magnetometer vector angle that do not match changes reported from the integrated rate-gyro.

For example, an occurrence of a perturbing event may be identified (detected) when the magnitude of the magnetometer reading at a given time is different from a previously known strength of the earth's magnetic field or when the magnetic declination angle (the angle between the down vector of the orientation filter and the vector as read from the magnetometer) has changed.

However, one or more of the above techniques can be mixed together using a mixing function, or other computational process, to arrive at a heuristic that acts as a magnetometer confidence factor. Thus, the confidence factor can be compared to a threshold to distinguish between states when the magnetometer is perturbation-free and when it is being perturbed. Each computed confidence factor is also stored, along with each set of sensor readings, in the buffer at each time-step.

At step 210, a current real-time orientation is computed by processing element 104 by taking a sensor reading that is at some point ($T_{shift}$) in the past from within the buffer of memory element 105 when the magnetometer 101 was known to be unperturbed and then adding a difference orientation as computed by integrating the readings from the rate-gyro 102 from the $T_{shift}$ point through to the current reading at $T_0$ (step 212) (e.g., determining an area under a curve with points derived from the readings). The result is an accurate real-time orientation that is free from any perturbation occurring after time $T_{shift}$. Since the gyro error is bounded by slowly accumulating integration error, the orientation computed will remain accurate within the bounds of this integration error over a duration of the time-shifting ($T_0$-$T_{shift}$).

As new magnetometer readings are taken (step 214), the $T_{shift}$ point may be moved forward in time when confidence factors for subsequent readings indicate that the magnetometer is in an unperturbed state (possibly for multiple subsequent readings). However, when confidence factors for subsequent readings indicate that the magnetometer is in a perturbed state, this will cause the $T_{shift}$ point to remain at the unperturbed point.

When a perturbation event is identified within the $T_0$-$T_{shift}$ period, a magnetometer calibration process may be started so that a new magnetometer calibration is computed by processing element 104 and subsequently adopted when the perturbation is due to a permanent or semi-permanent change to the magnetic environment (step 216). This new calibration may be adopted after a predetermined time (step 218).

Figure 3:
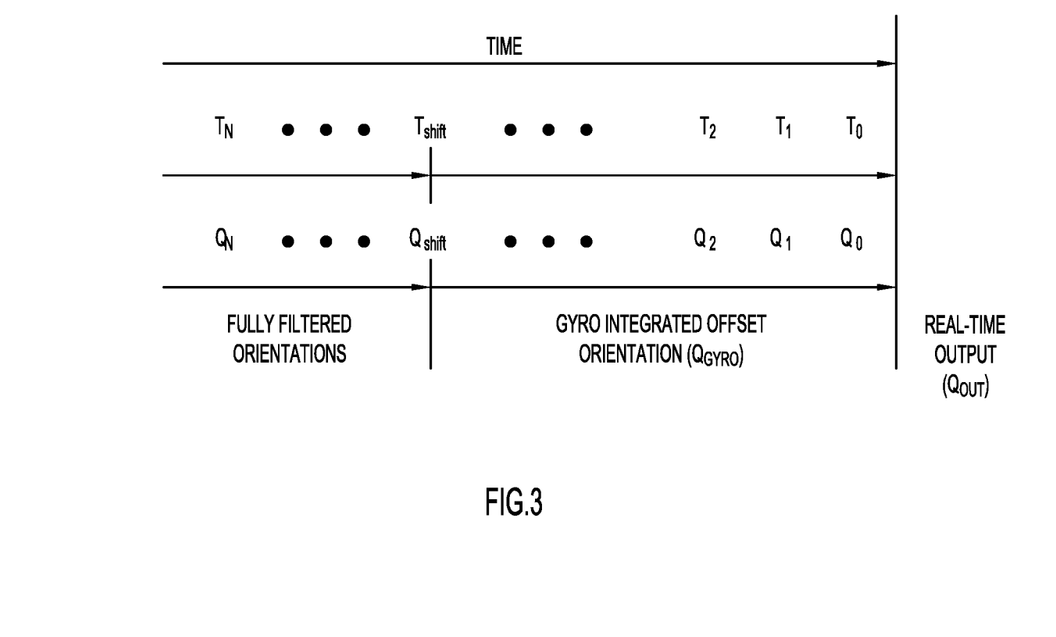
FIG. 3 is a graph representing an exemplary magnetometer calibration process using time-shifting according to an embodiment of the present invention.

As illustrated in FIG. 3, a real-time orientation output is computed by using a fully filtered orientation $Q_{shift}$ as computed at time $T_{shift}$ and adding an integrated rate-gyro offset orientation $Q_{Gyro}$ as computed from time $T_{shift}$ through $T_0$. Since $Q_{shift}$ is computed prior to a magnetic perturbation event and $Q_{Gyro}$ is computed based solely upon the integration of the gyro sensor data, which is unaffected by changes in the magnetic environment, the resulting output ($Q_{Out}$) for the system will be unaffected by magnetic events that occur during the time-shifted period ($T_{shift}$ through $T_0$).

Furthermore, since the magnetic perturbation immunity system of the present invention embodiment can determine with confidence that the magnetic environment is unperturbed, new $T_{shift}$ points can be chosen either continuously or periodically to ensure error-free real-time output (step 220). However, if it is determined that the system remains in the perturbed state, the time-shift point $T_{shift}$ can continue to be used while data is collected and a new magnetometer calibration is computed by processing element 104 (step 222) and subsequently applied after a predetermined time (step 224). Moreover, since a final unperturbed orientation is output in real-time, it can be used to construct a virtual sensor output that is unaffected by the perturbation. Thus, the final result could be a real-time output Inertial Measurement Unit (IMU), Attitude and Heading Reference System (AHRS), Inertial Navigation System (INS) or Compassing System that is unaffected by magnetic disturbances.

While the process of a present invention embodiment has been described with respect to magnetometer perturbation, it is important to note that this technique can also be used for accelerometer perturbation rejection.

Figure 4:
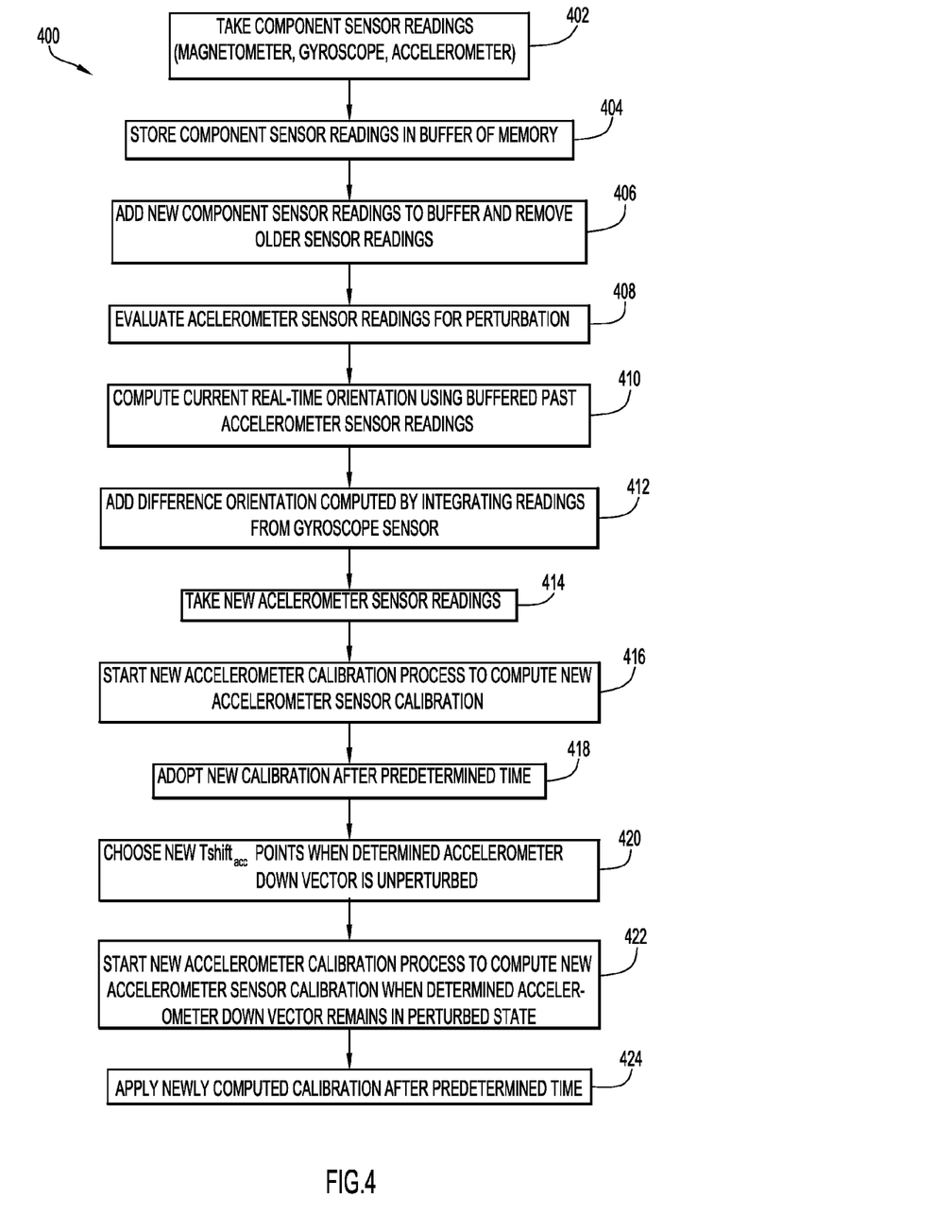
FIG. 4 is a flowchart depicting an example process for local accelerometer perturbation immunity according to an embodiment of the present invention.

FIG. 4 illustrates an example process for applying the technique for accelerometer perturbation. A method (process) 400 of an embodiment for accelerometer perturbation begins at step 402 by taking sensor readings from each axis of the component sensors (e.g., magnetometer, gyroscope, and accelerometer) as follows:

Magnetometer: MX, MY, MZ
Gyroscope: GX, GY, GZ
Accelerometer: AX, AY, AZ
Sample Timestamp: T
Computed Orientation: QX, QY, QZ, QW (may be in a form other than a quaternion)

At a given time, each set of sensor sample readings taken in step 402 is stored in a buffer of memory element 105 along with time-stamp (T) of the sensor readings (step 404). Thereafter, new samples are added to the buffer and older samples may be removed from the buffer so as to limit the buffer's size (step 406). This gives a historical buffer of N samples going back in time for an amount of time of duration $T_0$-$T_N$, where $T_0$ is the most recent reading and $T_N$ is an oldest historical reading.

Within this buffer, each set of accelerometer readings at a particular time is evaluated by the processing element 104 for perturbation (step 408). That is, since accelerometer perturbation can occur at any time, it is important to evaluate each sample in an attempt to identify an occurrence of a perturbing event. This is done using a heuristic that involves evaluating each accelerometer reading at a given time against for example, an expected magnitude of an accelerometer down vector.

For example, an occurrence of an accelerometer perturbing event may be identified (detected) when the magnitude of the accelerometer down vector at a given time is different from one g, which is 9.8 meters per second, by at least a predetermined or configurable amount.

The above technique may be used by itself or may be mixed together with another technique using a mixing function, or other computational process, to arrive at a heuristic that acts as an accelerometer confidence factor. Thus, the confidence factor can be compared to a threshold to distinguish between states when the accelerometer is perturbation-free and when it is being perturbed. Each computed confidence factor may be stored, along with each set of sensor readings, in the buffer at each time-step.

At step 410, a current real-time orientation is computed by processing element 104 by taking an accelerometer sensor reading that is at some point ($Tshift_{acc}$) in the past from within the buffer of memory element 105 when the accelerometer was known to be unperturbed and then adding a difference orientation as computed by integrating readings from the rate-gyro 102 from the $Tshift_{acc}$ point through to the current reading at $T_0$ (step 412) (e.g., determining an area under a curve with points derived from the readings). The result is an accurate real-time orientation that is free from any perturbation occurring after time $Tshift_{acc}$. Since the gyro error is bounded by slowly accumulating integration error, the orientation computed will remain accurate within the bounds of this integration error over a duration of the time-shifting ($T_0-Tshift_{acc}$).

As new accelerometer readings are taken (step 414), the $Tshift_{acc}$ point may be moved forward in time when confidence factors for subsequent readings indicate that the accelerometer is in an unperturbed state (possibly for multiple subsequent readings). However, when confidence factors for subsequent readings indicate that the accelerometer is in a perturbed state, this will cause the $Tshift_{acc}$ point to remain at the unperturbed point.

When an acceleration perturbation event is identified within the $T_0-Tshift_{acc}$ period, an accelerometer calibration process may be started so that a new accelerometer calibration is computed by processing element 104 and subsequently adopted in the case that the perturbation is due to a permanent or semi-permanent change due to movement or vibration of the accelerometer (step 416). This new calibration may be adopted after a predetermined time (step 418).

Figure 5:
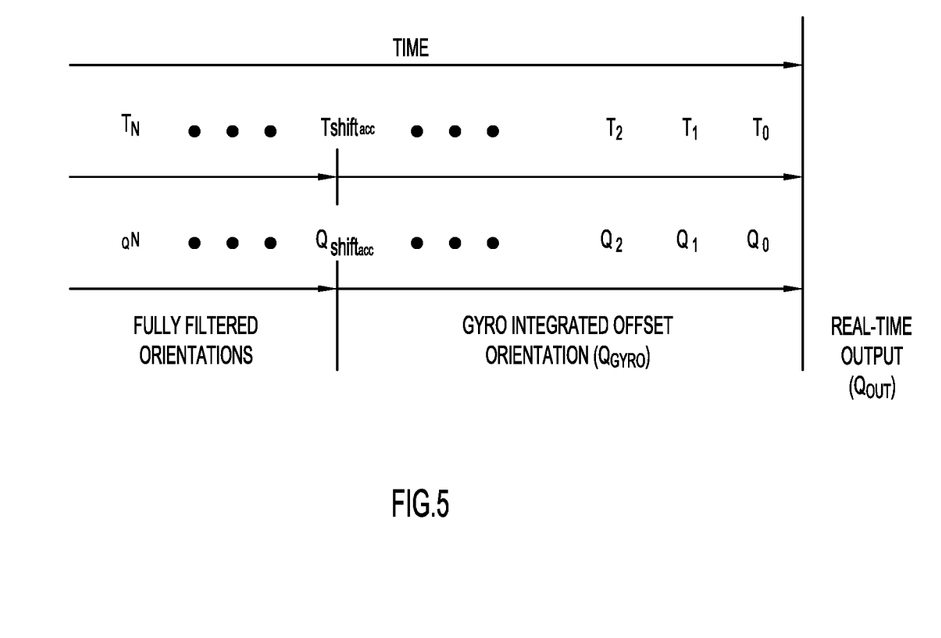
FIG. 5 is a graph representing an exemplary accelerometer calibration process using time-shifting according to an embodiment of the present invention.

As illustrated in FIG. 5, the real-time orientation output is computed by using the fully filtered orientation $Qshift_{acc}$ as computed at time $Tshift_{acc}$ and adding the integrated rate-gyro offset orientation $Q_{Gyro}$ as computed from time $Tshift_{acc}$ through $T_0$. Since $Q_{shift}$ is computed prior to an accelerometer perturbation event and $Q_{Gyro}$ is computed based solely upon the integration of the gyro sensor data, which is unaffected by movement or vibration, the resulting output ($Q_{Out}$) for the system will be unaffected by accelerometer perturbation events that occur during the time-shifted period ($Tshift_{acc}$ through $T_0$).

Furthermore, since the present invention embodiment can determine with confidence that the accelerometer reading is unperturbed, new $Tshift_{acc}$ points can be chosen either continuously or periodically to ensure error-free real-time output (step 420). However, if it is determined that the system remains in the perturbed state, the time-shift point $Tshift_{acc}$ can continue to be used while data is collected and a new accelerometer calibration is computed by processing element 104 (step 422) and subsequently applied after a predetermined time (step 424). Moreover, since a final unperturbed orientation is output in real-time, it can be used to construct a virtual accelerometer sensor output that is unaffected by the perturbation.

As described above, a present invention embodiment pertains to a system which has been developed to provide local magnetic perturbation immunity and/or to provide local accelerometer down vector perturbation immunity. The system may comprise, or be part of, Inertial Measurement Units (IMU), Attitude and Heading Reference Systems (AHRS), Compassing Systems and Inertial Navigation Systems (INS). The system identifies situations where either the magnetic environment or the accelerometer down vector, or both the magnetic environment and the accelerometer down vector are in a perturbed state relative to the original magnetic environment and/or the original accelerometer environment, and once identified, utilizes a time-shifting component to allow the system to completely reject the disturbance or disturbances for the duration of the perturbation, as well as to allow the system to perform potential recalibration steps without the real-time output of the system being noticeably affected.

In addition, the system of the present invention embodiments may include any number of processing devices (e.g., processor, controller, etc.), and may include any combination of hardware and/or software to perform the functions described above. These devices may include any types of displays and input devices (e.g., virtual or physical keyboard, mouse, voice recognition, touch screen, etc.) to enter and/or view information.

It is to be understood that software of the present invention embodiment may be implemented in any desired computer language and could be developed by one of ordinary skill in the computer arts based on the functional descriptions contained in the specification and flow diagrams illustrated in the drawings. Further, any references herein of software performing various functions generally refer to computer systems or processors performing those functions under software control. The processor of the present invention embodiment may alternatively be implemented by any type of hardware and/or other processing circuitry.

The software and/or algorithms described above and illustrated in the flow diagrams may be modified in any manner that accomplishes the functions described herein. In addition, the functions in the flow diagrams or description may be performed in any order that accomplishes a desired operation.

The software of the present invention embodiments may be available on a non-transitory computer useable medium (e.g., magnetic or optical mediums, magneto-optic mediums, floppy diskettes, CD-ROM, DVD, memory devices, etc.) of a stationary or portable program product apparatus or device for use with stand-alone systems or systems connected by a network or other communications medium.

The processing devices of the present invention embodiment may include any conventional or other communications devices to communicate via any conventional or other protocols. The processing systems or devices may utilize any type of connection (e.g., wired, wireless, etc.).

Further, the present invention embodiment may employ any number of any type of user interface (e.g., Graphical User Interface (GUI), etc.). The interface may provide a virtual reality environment, and/or be used for obtaining or providing information, where the interface may include any information arranged in any fashion. The interface may include any number of any types of objects and/or input or actuation mechanisms (e.g., buttons, icons, fields, boxes, links, etc.) disposed at any locations to enter/display information and initiate desired actions via any suitable input devices (e.g., mouse, virtual or physical keyboard, touch screen, etc.).

The invention claimed is:

1. A system for identifying a perturbation and providing local perturbation immunity, the system comprising:
   at least one vector-based sensing device from a group of vector-based sensing devices consisting of a magnetometer and an accelerometer;
   a gyroscope configured to sense a rate of change of angular velocity over time and provide output measurement data representing rates of change in 3-space;
   a processing element coupled to the at least one vector-based sensing device; and
   a memory element coupled to the processing element, wherein the processing element is operable to:
      evaluate measurement data from the at least one vector-based sensing device at a given time using a heuristic to identify an occurrence of a perturbing event, and
      provide a time-shifting component to reject the perturbing event for a duration of the perturbing event and use the measurement data from the gyroscope to construct vector-based sensing device measurement data unaffected by the perturbing event.

2. The system of claim 1, wherein:
   the at least one vector-based sensing device includes the magnetometer configured to sense a magnitude and a direction of a magnetic field and provide magnetic measurement data indicating the magnitude and the direction of the magnetic field in 3-space;
   the processing element is operable to store a most recent predetermined number of component sensor readings in the memory element; and
   the processing element is operable to provide the time shifting component to reject the perturbing event by performing:
      taking a magnetometer reading at some point in time $T_{shift}$ from the memory element when the magnetometer was known to be unperturbed,
      determining a difference orientation based on the measurement data from the gyroscope from the $T_{shift}$ point through a current reading of the measurement data from the gyroscope, and
      adding the determined difference orientation to a current reading of the magnetometer to produce perturbation-free magnetometer measurement data.

3. The system of claim 2, wherein the determining the difference orientation based on the measurement data from the gyroscope from the $T_{shift}$ point through the current reading of the measurement data comprises:
   integrating the measurement data from the gyroscope at the point $T_{shift}$ to the current reading of the measurement data from the gyroscope.

4. The system of claim 1, wherein the evaluating the measurement data from the at least one vector-based sensing device at the given time using the heuristic to identify the occurrence of a perturbing event comprises:
   evaluating each magnetometer reading at given times against at least one from a group consisting of:
      a length of a magnetometer vector,
      an angle between the magnetometer vector and a down vector of the accelerometer,
      a distance of the magnetometer vector from a surface of a previously computed magnetometer calibration sphere,
      changes in an angle or a direction of the magnetometer vector that do not match changes in a computed orientation, and
      differences in a change of the angle of the magnetometer vector that do not match changes reported from the gyroscope.

5. The system of claim 1, wherein:
   the at least one vector-based sensing device includes the accelerometer configured to sense acceleration forces;
   the processing element is operable to store a most recent predetermined number of component sensor readings in the memory element; and
   the processing element is operable to provide the time shifting component to reject the perturbing event by performing:
      taking an accelerometer sensor reading at some point in time $Tshift_{acc}$ from the memory element when the accelerometer was known to be unperturbed,
      determining a difference orientation based on the measurement data from the gyroscope from the $Tshift_{acc}$ point through a current reading of the measurement data from the gyroscope, and
      adding the determined difference orientation to a current accelerometer sensor reading to produce perturbation-free accelerometer measurement data.

6. The system of claim 5, wherein the determining the difference orientation based on the measurement data from the gyroscope from the $Tshift_{acc}$ point through the current reading of the measurement data from the gyroscope comprises:
   integrating the measurement data from the gyroscope at the point $Tshift_{acc}$ to the current reading of the measurement data from the gyroscope.

7. The system of claim 1, wherein the evaluating the measurement data from the at least one vector-based sensing device at the given time using the heuristic to identify the occurrence of a perturbing event comprises:
   evaluating the measurement data from the accelerometer at the given time against an expected magnitude of a down vector.

8. A method for identifying a perturbation and providing local perturbation immunity, the method comprising:
   evaluating, by a processing device, measurement data from at least one vector-based sensing device at a given time using a heuristic to identify an occurrence of a perturbing event, the at least one vector-based sensing device being from a group of vector-based sensing devices consisting of a magnetometer and an accelerometer; and
   providing, by the processing device, a time-shifting component to reject the perturbing event for a duration of the perturbing event and use measurement data from a gyroscope to construct vector-based sensing device measurement data unaffected by the perturbing event.

9. The method of claim 8, wherein:
   the at least one vector-based sensing device includes the magnetometer configured to sense a magnitude and a direction of a magnetic field and provide magnetic measurement data indicating a magnitude and a direction of a magnetic field in 3-space; and the method further comprises:
  storing, by the processing device, a most recent predetermined number of component sensor readings in a memory element coupled to the processing device; and
  the providing the time shifting component to reject the perturbing event further comprises:
    taking a magnetometer sensor reading at some point in time $T_{shift}$ from the memory element when the magnetometer was known to be unperturbed,
    determining a difference orientation based on the measurement data from the gyroscope from the $T_{shift}$ point through a current reading of the measurement data from the gyroscope, and
    adding the determined difference orientation to a current reading of the magnetometer to produce perturbation-free magnetometer measurement data.

10. The method of claim 9, wherein the determining the difference orientation based on the measurement data from the gyroscope from the $T_{shift}$ point through the current reading of the measurement data comprises:
  integrating the measurement data from the gyroscope at the point $T_{shift}$ to the current reading of the measurement data from the gyroscope.

11. The method of claim 8, wherein the evaluating the measurement data from the at least one vector-based sensing device at the given time using the heuristic to identify the occurrence of a perturbing event comprises:
  evaluating each magnetometer reading at given times against at least one from a group consisting of:
    a length of a magnetometer vector,
    an angle between the magnetometer vector and a down vector of the accelerometer,
    a distance of the magnetometer vector from a surface of a previously computed magnetometer calibration sphere,
    changes in an angle or a direction of the magnetometer vector that do not match changes in a computed orientation, and
    differences in a change of the angle of the magnetometer vector that do not match changes reported from the gyroscope.

12. The method of claim 8, wherein:
  the at least one vector-based sensing device includes the accelerometer configured to sense acceleration forces; and
  the method further comprises:
    storing a most recent predetermined number of component sensor readings in a memory element; and
    the providing the time shifting component to reject the perturbing event further comprises:
      taking an accelerometer sensor reading at some point in time $Tshift_{acc}$ from the memory element when the accelerometer was known to be unperturbed,
      determining a difference orientation based on the measurement data from the gyroscope from the $Tshift_{acc}$ point through a current reading of the measurement data from the gyroscope, and
      adding the determined difference orientation to a current accelerometer sensor reading to produce perturbation-free accelerometer measurement data.

13. The method of claim 12, wherein the determining the difference orientation based on the measurement data from the gyroscope from the $Tshift_{acc}$ point through the current reading of the measurement data further comprises:
  integrating the measurement data from the gyroscope at the point $Tshift_{acc}$ to the current reading of the measurement data from the gyroscope.

14. The method of claim 8, wherein the evaluating the measurement data from the at least one vector-based sensing device at the given time using the heuristic to identify the occurrence of the perturbing event further comprises:
  evaluating the measurement data from the accelerometer at the given time against an expected magnitude of a down vector.

15. A computer program product comprising at least one non-transitory computer readable storage medium having computer readable program code embodied therewith for execution on at least one processor, the computer readable program code being configured to be executed by the at least one processor to perform:
  evaluating measurement data from at least one vector-based sensing device at a given time using a heuristic to identify an occurrence of a perturbing event, the at least one vector-based sensing device being from a group of vector-based sensing devices consisting of a magnetometer and an accelerometer; and
  providing a time-shifting component to reject the perturbing event for a duration of the perturbing event and use measurement data from a gyroscope to construct vector-based sensing device measurement data unaffected by the perturbing event.

16. The computer program product of claim 15, wherein:
  the at least one vector-based sensing device includes the magnetometer configured to sense a magnitude and a direction of a magnetic field and provide magnetic measurement data indicating a magnitude and a direction of a magnetic field in 3-space; and
  the computer readable program code is further configured to cause the at least one processor to perform:
    storing a most recent predetermined number of component sensor readings in a memory element; and
    the providing the time shifting component to reject the perturbing event further comprises:
      taking a magnetometer reading at some point in time $T_{shift}$ from the memory element when the magnetometer was known to be unperturbed,
      determining a difference orientation based on the measurement data from the gyroscope from the $T_{shift}$ point through a current reading of the measurement data from the gyroscope, and
      adding the determined difference orientation to a current reading of the magnetometer to produce perturbation-free magnetometer measurement data.

17. The computer program product of claim 16, wherein the determining the difference orientation based on the measurement data from the gyroscope from the $T_{shift}$ point through the current reading of the measurement data comprises:
  integrating the measurement data from the gyroscope at the point $T_{shift}$ to the current reading of the measurement data from the gyroscope.

18. The computer program product of claim 15, wherein the evaluating the measurement data from the at least one vector-based sensing device at the given time using the heuristic to identify the occurrence of a perturbing event comprises:
  evaluating each magnetometer reading at given times against at least one from a group consisting of:
    a length of a magnetometer vector,
    an angle between the magnetometer vector and a down vector of the accelerometer, a distance of the magnetometer vector from a surface of a previously computed magnetometer calibration sphere, changes in an angle or a direction of the magnetometer vector that do not match changes in a computed orientation, and differences in a change of the angle of the magnetometer vector that do not match changes reported from the gyroscope.

19. The computer program product of claim 15, wherein:
the at least one vector-based sensing device includes the accelerometer configured to sense acceleration forces; and the computer readable program code is further configured to cause the at least one processor to perform:
storing a most recent predetermined number of component sensor readings in a memory element; and
the providing the time shifting component to reject the perturbing event further comprises:

taking an accelerometer sensor reading at some point in time $Tshift_{acc}$ from the memory element when the accelerometer was known to be unperturbed, determining a difference orientation based on the measurement data from the gyroscope from the $Tshift_{acc}$ point through a current reading of the measurement data from the gyroscope, and adding the determined difference orientation to a current accelerometer sensor reading to produce perturbation-free accelerometer measurement data.

20. The computer program product of claim 15, wherein the evaluating the measurement data from the at least one vector-based sensing device at the given time using the heuristic to identify the occurrence of the perturbing event further comprises:

evaluating the measurement data from the accelerometer at the given time against an expected magnitude of a down vector.

* * * * *